(12) United States Patent
Choi et al.

(10) Patent No.: US 10,686,147 B2
(45) Date of Patent: Jun. 16, 2020

(54) ORGANIC LIGHT EMITTING DISPLAY DEVICE AND MANUFACTURING METHOD THEREOF

(71) Applicant: LG DISPLAY CO., LTD., Seoul (KR)

(72) Inventors: Sungwoo Choi, Seoul (KR); Chulho Kim, Seoul (KR); Yunho Kook, Paju-si (KR); Kyuhwang Lee, Seoul (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/703,806

(22) Filed: Sep. 13, 2017

(65) Prior Publication Data

US 2018/0159054 A1 Jun. 7, 2018

(30) Foreign Application Priority Data

Dec. 7, 2016 (KR) .......................... 10-2016-0166049

(51) Int. Cl.
*H01L 51/00* (2006.01)
*H01L 51/56* (2006.01)
*H01L 27/32* (2006.01)

(52) U.S. Cl.
CPC ...... *H01L 51/0097* (2013.01); *H01L 27/3244* (2013.01); *H01L 27/3281* (2013.01); *H01L 51/56* (2013.01); *Y02E 10/549* (2013.01)

(58) Field of Classification Search
None
See application file for complete search history.

(56) References Cited

U.S. PATENT DOCUMENTS

| 3,992,141 A | * | 11/1976 | Baum | ..................... B29D 7/00 118/665 |
| 2002/0140347 A1 | * | 10/2002 | Weaver | ................. H01L 25/047 313/506 |
| 2005/0269943 A1 | * | 12/2005 | Hack | ................... H01L 51/0097 313/504 |
| 2007/0007893 A1 | | 1/2007 | Shin et al. | |
| 2007/0222370 A1 | | 9/2007 | Zhu et al. | |
| 2011/0114994 A1 | * | 5/2011 | Mandlik | ................. C23C 16/02 257/100 |
| 2011/0209901 A1 | * | 9/2011 | MacDonald | ............... C08J 7/04 174/254 |

(Continued)

FOREIGN PATENT DOCUMENTS

JP 2004176109 A * 6/2004

*Primary Examiner* — Erik Kielin
(74) *Attorney, Agent, or Firm* — Seed Intellectual Property Law Group LLP (57) ABSTRACT

A method for manufacturing an organic light emitting display device includes forming a substrate insulating film an upper surface, a lower surface, and at least one of two side surfaces of a substrate and forming an organic light emitting diode (OLED) on the substrate on which the substrate insulating film is formed. An organic light emitting display device includes a substrate having a first surface, a second surface opposite to the first surface, and side surfaces that extend between the first surface and the second surface, a substrate insulating film disposed on the first surface, the second surface, and at least one of the side surfaces of the substrate, and an OLED disposed on one of the first surface or the second surface of the substrate including the substrate insulating film.

18 Claims, 5 Drawing Sheets

(56) References Cited

U.S. PATENT DOCUMENTS

| | | |
|---|---|---|
| 2013/0092239 A1 | 4/2013 | Mori |
| 2014/0020542 A1* | 1/2014 | Heo ........................ B26D 3/00 |
| | | 83/862 |
| 2014/0071353 A1* | 3/2014 | Nashiki ............... G02F 1/13338 |
| | | 349/12 |
| 2014/0166337 A1* | 6/2014 | Ogura .................... C23C 26/00 |
| | | 174/110 R |
| 2015/0123088 A1 | 5/2015 | Osaki et al. |
| 2017/0174854 A1* | 6/2017 | Clark ................... B44C 1/1708 |
| 2018/0145124 A1* | 5/2018 | Kim ................... H01L 51/5253 |

\* cited by examiner

ORGANIC LIGHT EMITTING DISPLAY DEVICE AND MANUFACTURING METHOD THEREOF

CROSS-REFERENCE TO RELATED APPLICATION

Pursuant to 35 U.S.C. § 119(a), this application claims the benefit of earlier filing date and right of priority to Korean Application No. 10-2016-0166049, filed on Dec. 7, 2016, the contents of which is incorporated by reference herein in its entirety.

BACKGROUND

Technical Field

The present disclosure relates to an organic light emitting display device and a manufacturing method thereof.

Description of the Related Art

In general, an organic light emitting display device is a self-luminous display device in which an organic compound is electrically excited to emit light. The organic light emitting display device is classified as a passive matrix type and an active matrix type depending on a scheme in which N×M number of unit pixels disposed in a matrix form are driven.

Compared with the passive matrix type organic light emitting display device, the active matrix type organic light emitting display device consumes less power so as to be appropriate for implementing a large area and has high resolution.

Also, the organic light emitting display device is classified as a top emission type, a bottom emission type and a top-bottom emission type depending on a direction in which light emitted from an organic compound is emitted.

Unlike the bottom emission type organic light emitting display device, the top emission type organic light emitting display device is a device in which light is emitted in a direction opposite to a substrate in which unit pixels are positioned, advantageously having a large aperture ratio.

Hereinafter, a manufacturing process of the related art organic light emitting display device will be described.

Recently, as a substrate tends to be flexible, an organic light emitting display device may be manufactured in a roll-to-roll manner to achieve convenience in process and shorten a process time. That is, the roll-to-roll method is a method of unwinding a roll type substrate film and sequentially forming components required for the organic light emitting display device on the substrate film to manufacture an organic light emitting display device.

The roll type substrate film is required to have flexibility and mechanical rigidity, and thus, it may be configured of a thin metal film such as a metal foil, or the like.

Here, when an organic light emitting display device is formed on a substrate formed of a metal foil in the roll-to-roll manner, the following problem may arise.

In cases where a test sample such as a metal, semiconductor, and the like, applied to the substrate formed of the metal foil is etched, the metal foil, as well as the sample to be etched, may also be etched or may be cut to a certain form.

Thus, the substrate, which is required to be maintained in mechanical rigidity until a process is finished, may corrode to be distorted, causing the organic light emitting display device to be manufactured to be defective.

Also, when plasma is used, plasma is required to be applied only to a sample to be etched. However, since the substrate formed of the metal foil has conductivity, plasma is applied also to the substrate. Thus, the substrate may be cut due to a high current flowing in the substrate, and thus, the process of the organic light emitting device may not be performed any further.

BRIEF SUMMARY

Therefore, an aspect of the detailed description is to provide an organic light emitting device in which a substrate insulating film is formed on an outer surface of a substrate to protect the substrate, and a manufacturing method thereof.

To achieve these and other advantages and in accordance with the purpose of this specification, as embodied and broadly described herein, a method for manufacturing an organic light emitting display device may include a substrate insulating film forming step and an organic light emitting diode (OLED) forming step.

In the substrate insulating film forming step, a substrate insulating film may be formed on an upper surface, a lower surface, and at least one of two side surfaces of a substrate.

An organic light emitting display device according to the present disclosure may include a substrate insulating film and an OLED. The substrate may have a first surface, a second surface opposite to the first surface, and side surfaces that extend between the first surface and the second surface. The substrate insulating film may be disposed on the first surface, the second surface, and at least one of the side surfaces of the substrate. The OLED may be disposed on one of the first surface or the second surface of the substrate on which the substrate insulating film is formed.

According to embodiments of the present disclosure, through the aforementioned substrate insulating film, the substrate as a manufacturing basis of the organic light emitting display device may be protected. That is, since the substrate insulating film is disposed on the outer surface of the substrate to cover the substrate, the etchant cannot penetrate through the substrate. Thus, the substrate is not damaged. Also, since a current cannot flow in the substrate insulating film as a nonconductor, a current does not flow in the substrate, preventing the substrate from being cut.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the scope of the disclosure will become apparent to those skilled in the art from the detailed description.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a method for manufacturing an organic light emitting device according to an embodiment of the present disclosure will be described in detail with reference to the accompanying drawings.

Figure 1:
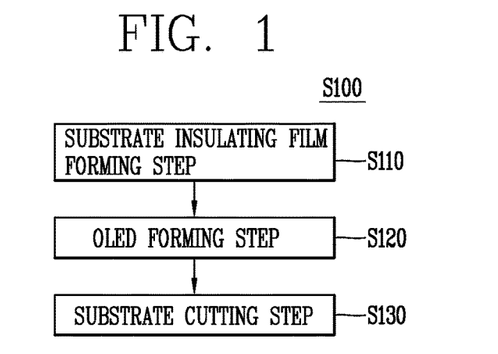
FIG. 1 is a flow chart illustrating a method for manufacturing an organic light emitting device according to an embodiment of the present disclosure.

FIG. 1 is a flow chart illustrating a method for manufacturing an organic light emitting device according to an embodiment of the present disclosure.

As illustrated in FIG. 1, a manufacturing method S100 of an organic light emitting display device includes a substrate insulating film forming step S110, an organic light emitting diode (OLED) forming step S120, and a substrate cutting step S130.

Although not shown, the manufacturing method may further include a thin film transistor (TFT) forming step (not shown) of controlling the OLED before the OLED forming step S120 and an encapsulant layer forming step (not shown) of forming an encapsulant layer to protect the OLED before the substrate cutting step S130.

Figure 2A:
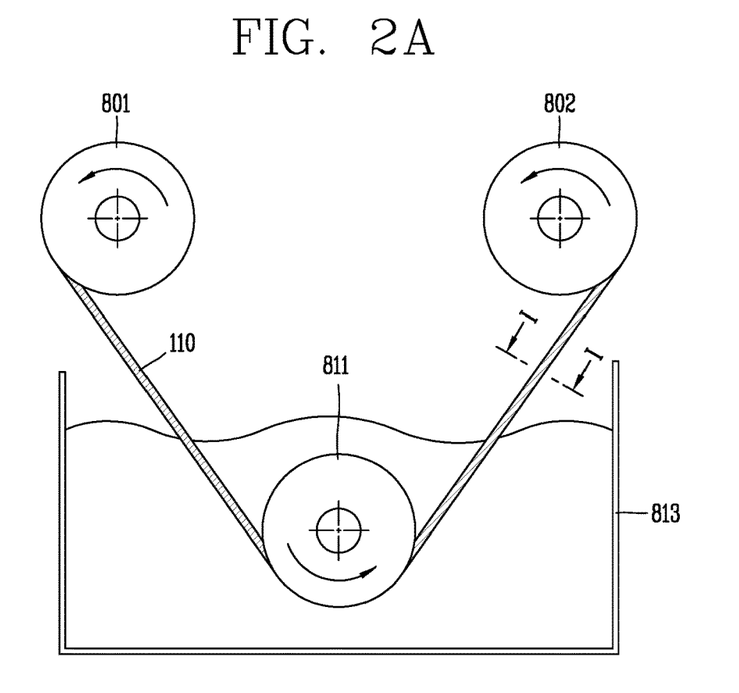
FIGS. 2A and 2B are views illustrating a process of forming a substrate insulating film according to an embodiment of the present disclosure.
Figure 2B:
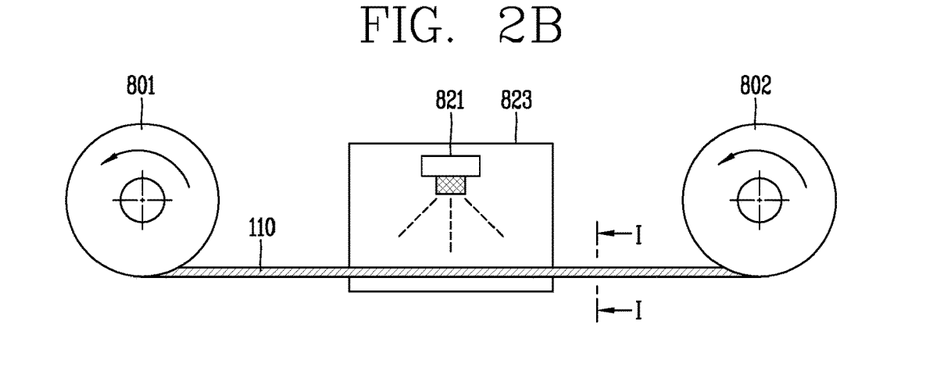

FIGS. 2A and 2B are views illustrating a process of forming a substrate insulating film according to an embodiment of the present disclosure.

The substrate 110 may be formed of a flexible material, and thus, an organic light emitting display device may be formed in a roll-to-roll manner. That is, the substrate 110 is moved through an unwinding roll for unwinding the roll type flexible substrate 110 and a winding roll for winding the flexible substrate 110. Components required for the organic light emitting display device are formed on the moving substrate 110 and the substrate 110 is cut to manufacture the organic light emitting display device. Accordingly, the substrate insulating film forming step S110 may also be performed in a roll-to-roll manner as illustrated in FIGS. 2A and 2B. Here, the substrate 110 may be formed of any one of a transparent insulating substrate, metal, plastic, and a polymer film having flexible characteristics.

As illustrated in FIG. 2A, a tank 813 is filled with an insulating sample, a material for forming a substrate insulating film (not shown). The insulating sample may be an organic insulating material or an inorganic insulating material forming the substrate insulating film.

The organic insulating material and the inorganic insulating material may be formed of a high heat-resistance material which may not be damaged in a follow-up process. In detail, the organic insulating material may be formed of benzocyclobutene (BCB), an acrylic resin, and the like, and the inorganic insulating material may be formed of one of $Al_2O_3$, $ZrO_2$, $HfO_2$, $TiO_2$, $ZnO$, $Y_2O_3$, $CeO_2$, $Ta_2O_5$, $La_2O_5$, $Nb_2O_5$, $SiO_2$, and $SiN_x$.

Also, a first unwinding roll 801 and a first winding roll 802 for moving the substrate 110 from outside of the water tank 813, and a tank roll 811 for dipping the substrate 110 to the insulating sample within the tank 813 are provided.

That is, the first unwinding roll 801 and the first winding roll 802 move the substrate 110 from the outside of the tank 813, and the substrate 110 is dipped into the insulating sample due to the tank roll 811, which is positioned in the tank 813. In this manner, the substrate insulating film is formed on the substrate 110. Here, in a state in which a portion of an outer surface of the substrate 110 is not exposed using a mask, when the substrate 110 passes through the tank 813 filled with the insulating sample using the tank roll 811, the substrate insulating film may be formed only on the exposed portion of the outer surface of the substrate.

Also, the substrate insulating film may be formed as multiple layers, rather than a single layer, by repeating the process of dipping the substrate 110 a plurality of times. Here, the substrate insulating film may be formed as an insulating film including multiple layers formed by repeating an organic insulating material and an inorganic insulating material.

Also, as illustrated in FIG. 2B, the substrate insulating film may be formed by depositing the insulating sample on the substrate 110. That is, a chamber 823 including an evaporator 821 for evaporating an insulating sample may be provided, and the first unwinding roll 801 and the first winding roll 802 may be provided for moving the substrate 110 from the outside through the chamber 823.

That is, the first unwinding roll 801 and the first winding roll 802 may move the substrate 110 through the chamber 823, and the substrate 110 moving within the chamber 823 may form the substrate insulating film through the evaporator 821. The substrate insulating film may be formed of an atomic layer deposition (ALD) method, but the present disclosure is not limited thereto and various other deposition methods such as physical vapor deposition (PVD), chemical vapor deposition (CVD), and the like, may also be used.

Also, the substrate insulating film may be formed as multiple layers, rather than a single layer, by repeating the process of depositing the insulating sample on the substrate 110 a plurality of times. Here, the substrate insulating film may be formed as an insulating film including multiple layers formed by repeating an organic insulating material and an inorganic insulating material.

Also, although not shown, the substrate insulating film may be formed, separately from the substrate 110, and the formed substrate insulating film and the substrate 110 may be thermally bonded to dispose the substrate insulating film on the substrate 110.

Figure 3:
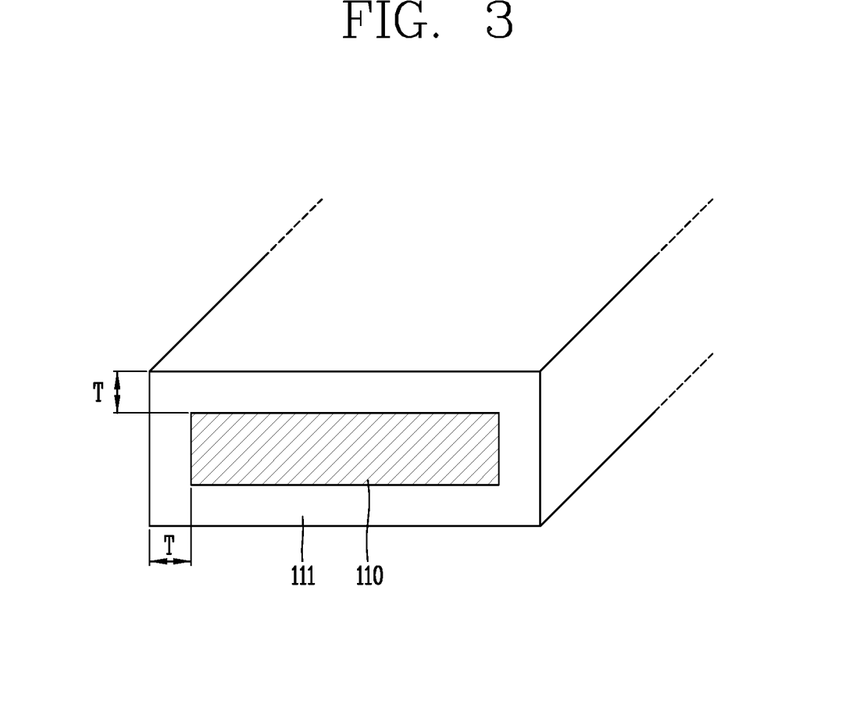
FIGS. 3 and 4 are views illustrating a cross-section taken along line I-I of FIGS. 2A and 2B.
Figure 4:
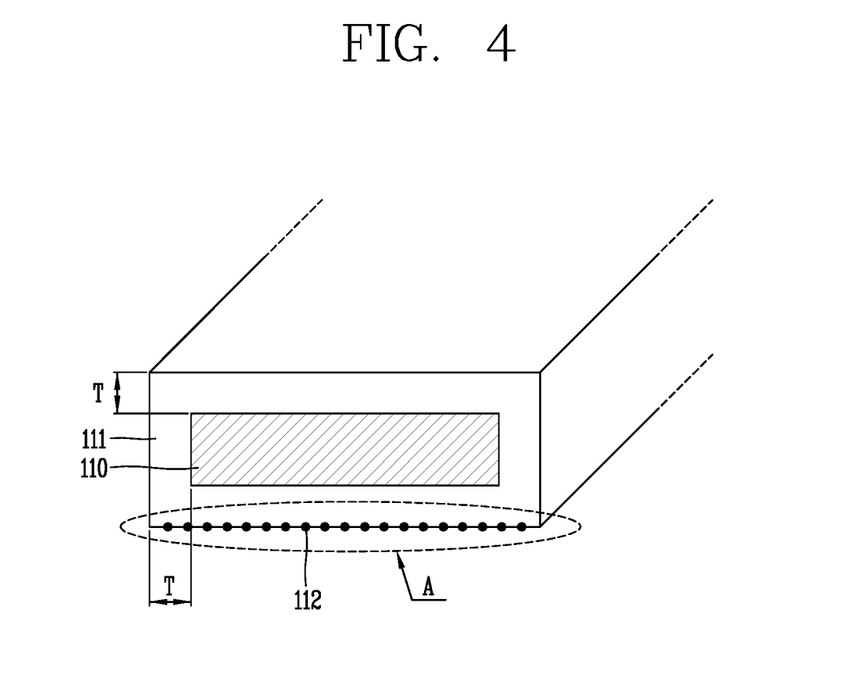

FIGS. 3 and 4 are views illustrating a cross-section taken along line I-I of FIGS. 2A and 2B.

As illustrated in FIG. 3, a thickness T of the substrate insulating film 111 may be uniform. The reason is because, in both the dipping method and the deposition method of forming the substrate insulating film 111 by dipping the substrate 110 in the tank 813, the insulating sample is evenly applied to the outer surface of the substrate 110.

In detail, the substrate insulating film 111 may be formed to have the same thickness T uniformly on the entire outer surface of the substrate 110. Here, the thickness T of the substrate insulating film 111 may range from 1 μm to 10 μm, inclusive. The thickness T of the substrate insulating film 111 may be at least 1 μm to prevent damage to the substrate 110 due to plasma and an etchant during a process described hereinafter. Also, the thickness T of the substrate insulating film 111 may be 10 μm or less in order to minimize a degradation of mechanical strength of the entire substrate 110 due to bonding of the substrate insulating film 111 having low mechanical strength.

Also, the substrate insulating film 111 may serve to protect a TFT formed in a follow-up process from an impurity such as alkali ions discharged from the substrate 110 and may also serve to smooth a rough surface of an outer surface of the substrate 110 to improve contact characteristics with the outside, e.g., with one or more external components or structures.

Also, as illustrated in FIG. 4, a fine filler 112 may be disposed on a surface of the formed substrate insulating film 111. In detail, as illustrated in a region indicated by "A", the fine filler 112 is formed on the surface of the substrate insulating film 111 formed on a lower surface of the substrate 110. Here, the lower surface of the substrate 110 generally refers to a surface opposing an upper surface on which a TFT and an OLED are formed. That is, a surface of the substrate insulating film 111 formed on a lower surface of the substrate 110 and a transfer belt (not shown) transferring the substrate 110 face each other. By forming the fine filler 112 on the surface of the substrate insulating film 111, the transfer belt and the substrate insulating film 111 may be prevented from being bonded to each other during a high temperature process, and the transfer belt and the substrate insulating film 111 are prevented from sliding during a process to thus prevent a defect in the process.

Here, the fine filler 112 may have a spherical shape with a diameter less than the thickness T of the substrate insulating film 111. In detail, the fine filler 112 may have a spherical shape with a diameter of at least 0.1 μm. Also, the fine filler 112 may be formed of a silica-based material as a heat resistant material that maintains its shape during a high temperature process.

Thereafter, although not shown, a TFT including a gate electrode, a source electrode, and a drain electrode may be formed on the substrate 110 on which the substrate insulating film 111 is formed. Here, the TFT controls an OLED to be described hereinafter.

In forming the TFT, a gate electrode is formed on the substrate 110 on which the substrate insulating film 111 is formed, and the gate electrode is covered by a gate insulating film. Thereafter, an active layer is formed by patterning an oxide semiconductor or an organic semiconductor on the gate insulating film. Thereafter, a source electrode and a drain electrode are formed on the active layer. The TFT forming step may also be performed in a roll-to-roll manner.

Here, the gate electrode and the source electrode/drain electrode may be formed as a single layer or multi-layer formed of a metal having excellent conductivity, for example, aluminum (Al), copper (Cu), molybdenum (Mo), chromium (Cr), gold (Au), titanium (Ti), nickel (Ni), neodymium (Nd), or an alloy thereof.

Figure 5:
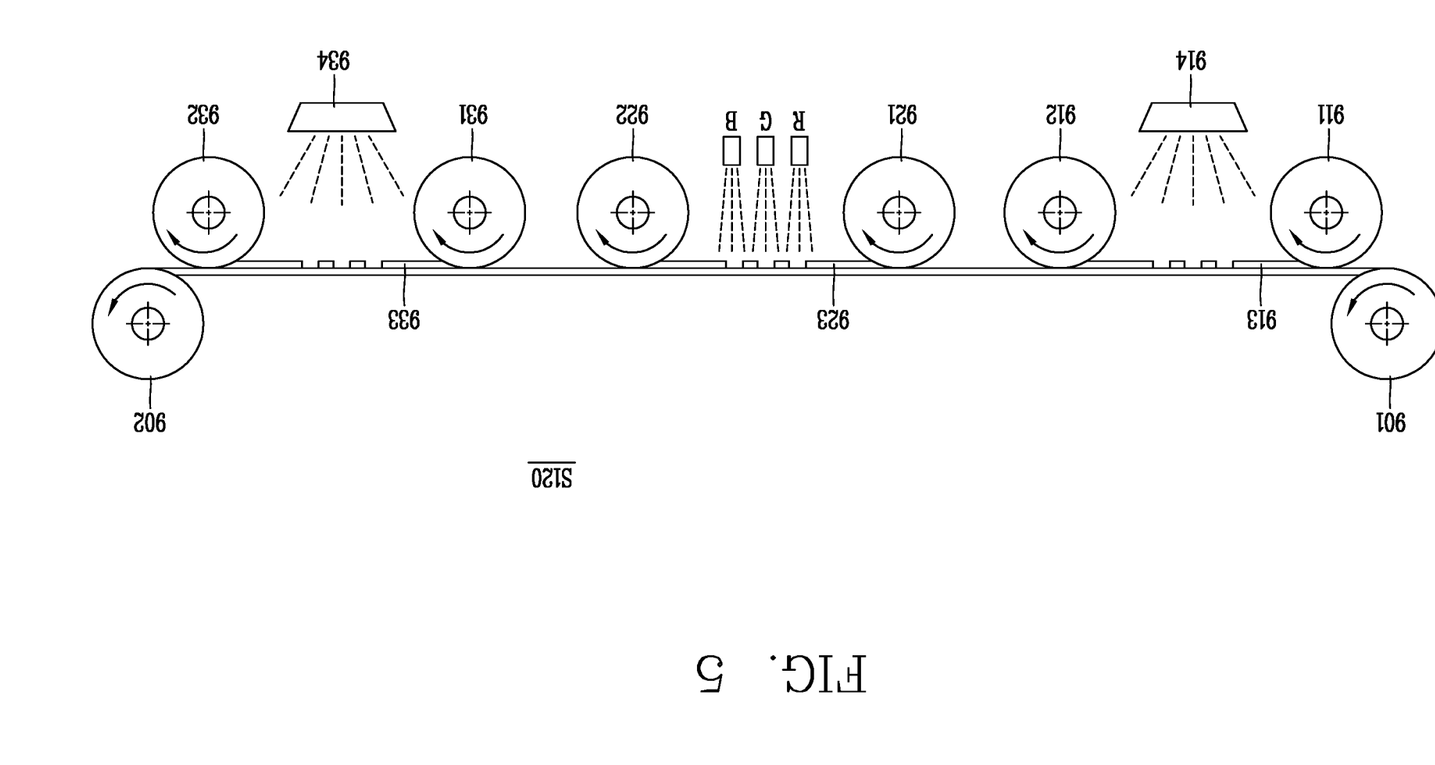
FIG. 5 is a view illustrating a process of forming an organic light emitting diode (OLED) in a roll-to-roll manner according to an embodiment of the present disclosure.
Figure 6:
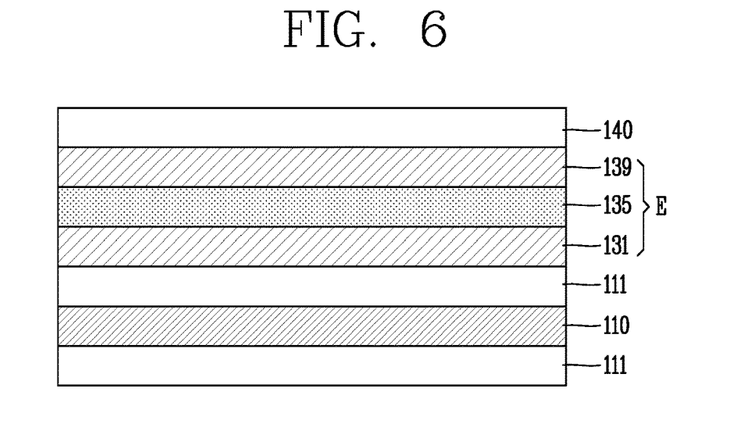
FIG. 6 is a cross-sectional view of an organic light emitting device according to an embodiment of the present disclosure.

FIG. 5 is a view illustrating a process of forming an organic light emitting diode (OLED) in a roll-to-roll manner according to an embodiment of the present disclosure, and FIG. 6 is a cross-sectional view of an organic light emitting device according to an embodiment of the present disclosure.

In an OLED forming step S120, a first electrode 131, an organic layer 135, and a second electrode 139 are sequentially formed. Substrate winding and unwinding rolls 901, 902 move the substrate 110 including the substrate insulating film 111 through the OLED forming process.

The first electrode 131 is formed to be electrically connected to the drain electrode on the substrate 110 including the substrate insulating film 111. That is, the first electrode 131 is formed by patterning a metal sample on the substrate 110 including the aforementioned TFT using a first pattern mask 913. First mask unwinding and winding rolls 911, 912 apply the first pattern mask 913, and the first electrode 131 is formed, for example, by depositing the metal sample using an evaporator 914.

Here, the metal sample is formed of a transparent conductive material, for example, indium tin oxide (ITO) or indium zinc oxide (IZO). The metal sample may be replaced with any other metal such as silver (Ag), an Ag alloy, copper (Cu), a Cu alloy, aluminum (Al), an Al alloy, aluminum-neodymium, and the like.

Thereafter, an organic layer 135 is formed on the first electrode 131. Here, the organic layer 135 is illustrated to have a single layer structure, for example, but it may also have a multi-layer structure to enhance luminance efficiency.

Here, the organic layer 135 may have a low molecular or polymer organic substance. When a low molecular organic substrate is used, the organic layer 135 may be formed by stacking a hole injection layer (HIL), a hole transport layer (HTL), an emission layer (EML), an electron transport layer (ETL), an electron injection layer (EIL), and the like, as having a single or composite structure, and organic materials such as copperphthalocyanine (CuPc), N, N'-Di(naphthalene-1-yl)-N, N'-diphenyl-benzidine (NPB), tris-8-hydroxy-quinoline aluminum)(Alq3), and the like, may be variously applied. These low molecular organic substances may be formed through a method of vapor deposition using masks.

As illustrated in FIG. 5, an organic substrate may also be deposited in a roll-to-roll manner. That is, the organic layer 135 may be formed by depositing an organic substrate in a vacuum state using a second mask unwinding roll 921 and a second mask winding roll 922 to move a second pattern mask 923 in a roll type.

Thereafter, a metal sample is patterned using a third pattern mask 933 on the organic layer 135 to form a second electrode 137. Third mask unwinding and winding rolls 931, 932 apply the third pattern mask 933, and the metal sample is applied, for example, by depositing the metal sample using evaporator 934. Here, the metal sample is formed of a transparent conductive material, for example, ITO or IZO. Also, the metal sample may be replaced with any other conductive metal such as Ag, an Al alloy, Cu, a Cu alloy, Al, an aluminum alloy, Al—Nd, and the like.

Here, the first electrode 131 may be an anode electrode and the second electrode 139 may be a cathode electrode.

Thereafter, an encapsulant layer 140 is formed on the front surface of the substrate 110 on which the second electrode 139 is formed. The encapsulant layer 140 protects the OLED E from an external impact and prevents penetration of moisture to the OLED E. The encapsulant layer 140 may be formed of an epoxy-based compound, an acrylate compound, an acrylic compound, and the like.

Finally, the substrate including the substrate insulating film 111 on which the OLED E is formed is cut to complete an organic light emitting display device (S130).

Figure 7A:
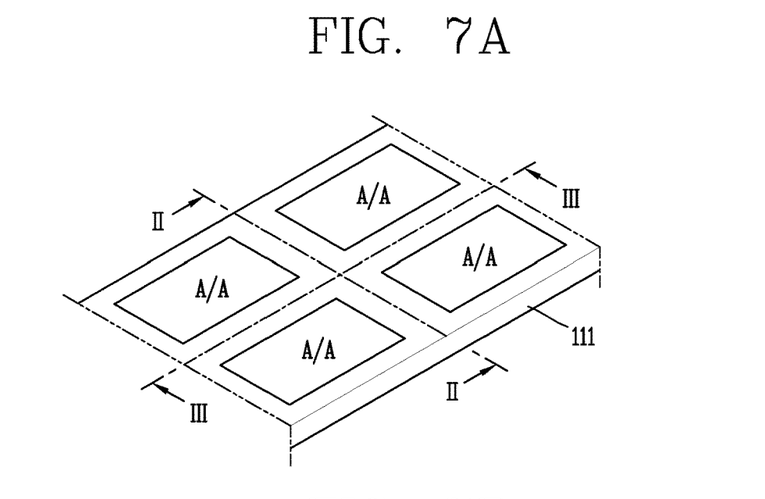
FIGS. 7A and 7B are views illustrating a process of cutting a substrate.
Figure 7B:
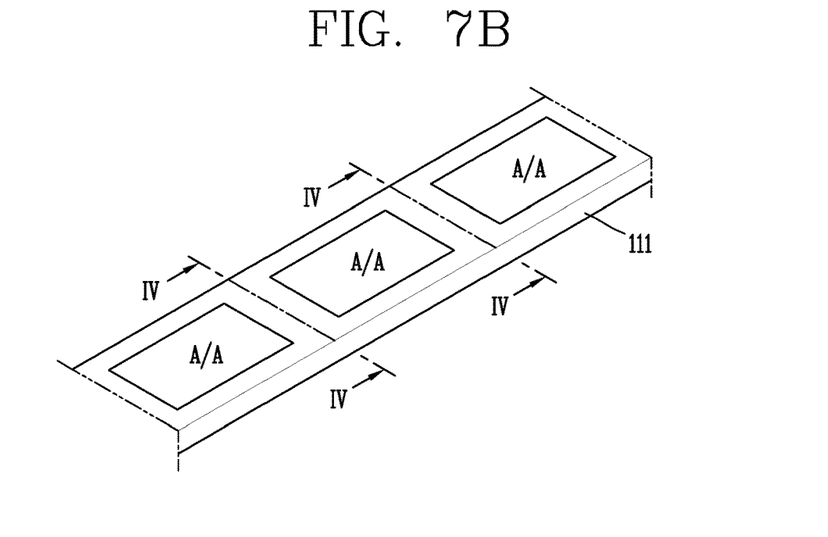

FIGS. 7A and 7B are views illustrating a process of cutting a substrate.

Here, in the step (S130) of cutting the substrate 110, the substrate 110 is cut on the basis of a display area (A/A) in which the OLED E emits light. Here, a tool for cutting the substrate 110 may be a laser, although embodiments provided herein are not limited to a laser, and various cutting units may be used.

In detail, as illustrated in FIG. 7A, in cases where the display areas (A/A) are formed side-by-side with respect to a direction in which the substrate 110 is unwound, the substrate 110 may be cut along the line II-II in a direction perpendicular to the unwinding direction and may also be cut along the line III-III in a direction parallel to the unwinding direction. In contrast, as illustrated in FIG. 7B, in cases where only one display area (A/A) is formed with respect to the direction in which the substrate 110 is unwound, the substrate 110 may be cut along the line VI-VI in a direction perpendicular to the unwinding direction. Through the substrate cutting step S130 (FIG. 1), an organic light emitting display device may be finally manufactured.

In this manner, after the substrate insulating film 111 is formed on an outer surface of the substrate 110, the organic light emitting display device may be manufactured. Through the substrate insulating film 111, the substrate 110 as a basis of manufacturing the organic light emitting display device may be protected.

In detail, the manufacturing process of the organic light emitting display device may include various patterning processes. In the patterning step, a required sample such as a metal, semiconductor, and the like, is applied through deposition, or the like, on the substrate 110 formed of a roll type metal foil and subsequently etched to have a desired shape. Here, the etching may be wet etching performed using an etchant or dry etching performed using plasma, or the like.

That is, in the case of wet etching using an etchant, the etchant should penetrate into only the sample to be etched. To this end, since the substrate insulating film 111 is disposed on the outer surface of the substrate 110 to cover the substrate 110, the etchant cannot penetrate into the substrate 110. Thus, the substrate 110 is not damaged. Also, in the case of dry etching using plasma, plasma should be applied only to the sample to be etched. To this end, since the substrate insulating film 111 is disposed on the outer surface of the substrate 110 to cover the substrate 110, a current may not flow to the substrate insulating film 111 as a nonconductor. Thus, since a current does not flow in the substrate 110, the substrate 110 is prevented from being cut. As a result, the manufacturing process of the organic light emitting display device may be performed without damaging the substrate 110.

Hereinafter, an organic light emitting display device according to an embodiment of the present disclosure will be described in detail with reference to the accompanying drawings.

Figure 8A:
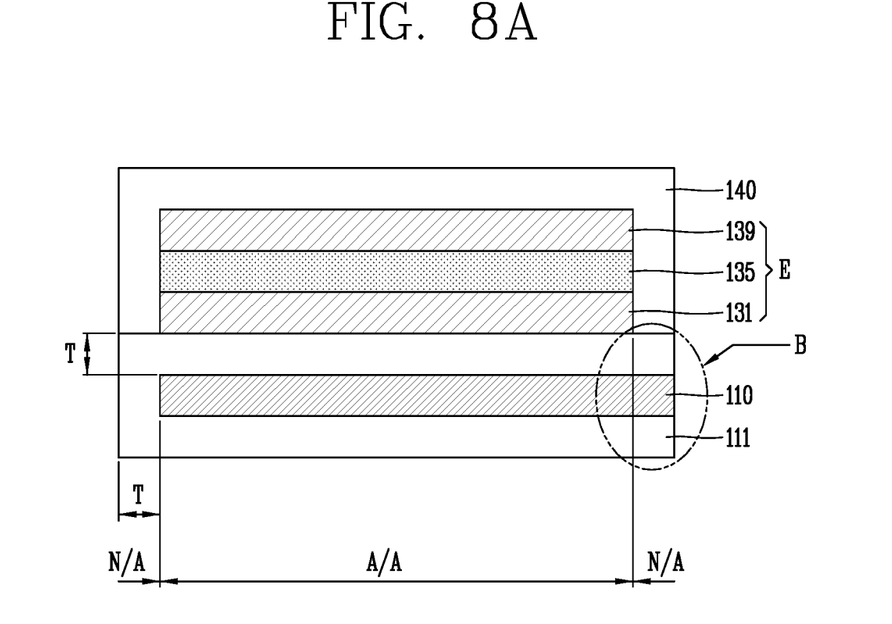
FIGS. 8A and 8B are cross-sectional views of an organic light emitting device according to an embodiment of the present disclosure.
Figure 8B:
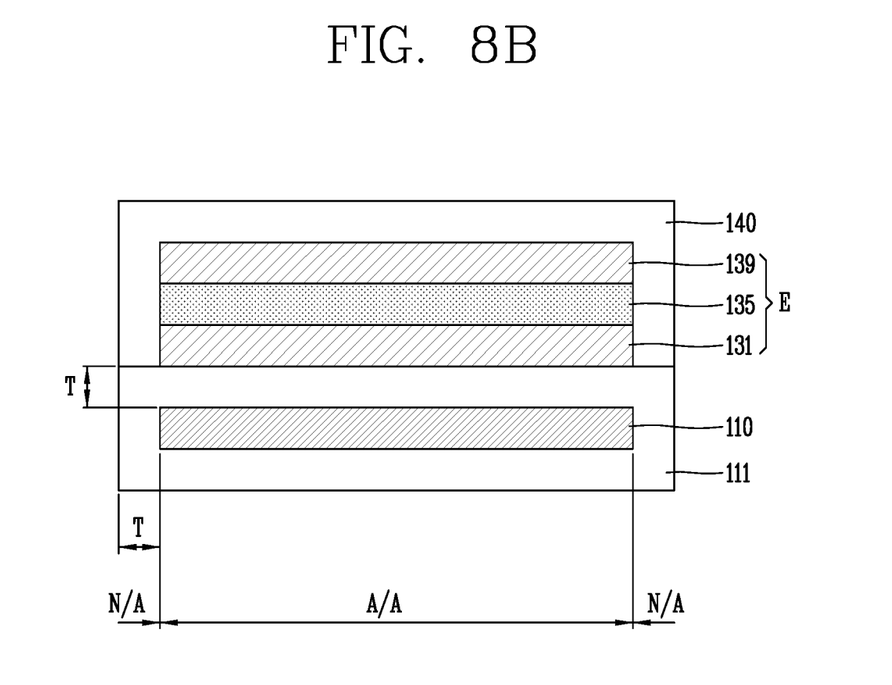

FIGS. 8A and 8B are cross-sectional views of an organic light emitting device according to an embodiment of the present disclosure.

Referring to FIGS. 8A and 8B, the organic light emitting device may include the substrate 110, the substrate insulating film 111, a TFT (not shown), the OLED E, and the encapsulant layer 140.

The substrate insulating film 111 is disposed to cover an outer surface of the substrate 110 to prevent damage due to an external impact and minimize chemical deformation due to exposure.

In detail, FIG. 8A is a cross-sectional view of the organic light emitting display device manufactured by cutting the substrate 110 in such a manner as illustrated in FIG. 7A, and FIG. 8B is a cross-sectional view of the organic light emitting display device manufactured by cutting the substrate 110 in such a manner as illustrated in FIG. 7B.

As illustrated in FIG. 8A, in cases where an outer surface of the substrate 110 in a direction in which the OLED E is formed, among outer surfaces of the substrate 110, is defined as an upper surface, the substrate insulating film may be formed on the upper surface, the lower surface, and only one side surface of the substrate 110. That is, as illustrated in in region "B" of FIG. 8A, a portion of the substrate 110 may be exposed along a side surface after cutting. Also, as illustrated in FIG. 8B, the substrate insulating film 111 may be formed on the entire surface of the substrate 110 to cover the substrate 110. That is, the substrate 110 may not be outwardly exposed due to the presence of the substrate insulating film 111.

Here, a thickness T of the substrate insulating film 111 may range from 1 μm to 10 μm. The thickness T of the substrate insulating film 111 is required to be 1 μm or greater to prevent damage due to an external impact or an external chemical change. Also, the thickness T of the substrate insulating film 111 is required to be 10 μm or less to minimize a degradation of mechanical strength of the entire substrate 110 due to bonding of the substrate insulating film 111 having low mechanical strength.

Also, the substrate insulating film 111 may be formed of a high heat-resistant organic insulating material and inorganic material. In detail, the organic insulating material may include BCB and an acrylic resin, and the inorganic insulating material may include any one of $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, and $SiN_x$.

Also, the substrate insulating film 111 may serve to protect a TFT formed in a follow-up process from impurities such as an alkali ions discharged from the substrate 110 and smooth a rough outer surface of the substrate 110 to enhance contact characteristics with the outside.

Also, as illustrated in FIG. 4, the fine filler 112 may be disposed on the surface of the formed substrate insulating film 111. In detail, as illustrated in the region "A", the fine filler 112 is formed on the surface of the substrate insulating film 111 formed on a lower surface of the substrate 110. Here, the lower surface of the substrate 110 generally refers to a surface opposing an upper surface on which a TFT and the organic light emitting display device (E) are formed. That is, a surface of the substrate insulating film 111 formed on a lower surface of the substrate 110 and a transfer belt (not shown) transferring the substrate 110 face each other. By forming the fine filler 112 on the surface of the substrate insulating film 111, the transfer belt and the substrate insulating film 111 may be prevented from being bonded to each other during a high temperature process, and the transfer belt and the substrate insulating film 111 are prevented from sliding in surfaces thereof during a process to thus prevent a defect in the process.

Here, the fine filler 112 may have a spherical shape with a diameter shorter than the thickness T of the substrate insulating film 111. In detail, the fine filler 112 may have a spherical shape with a diameter of at least 0.1 μm. Also, the fine filler may be formed of a silica-based material as a heat resistant material maintained in shape during a high temperature process.

The TFT (not shown) is disposed on the substrate 110 to control a current applied to the OLED E. In detail, in the TFT, when a signal is applied from a gate line (not shown) to drive a switching transistor (not shown), a signal of a data line (not shown) is transferred to a gate electrode of the TFT. Then, the TFT is turned on and a signal of a power line (not shown) may be transferred to the OLED E. Here, a level of the current flowing from the power line to the OLED E is determined, and accordingly, the OLED E implements a gray scale.

The OLED E includes a first electrode 131, an organic layer 135, and a second electrode 139.

The first electrode 131 may receive a signal through the TFT.

The first electrode 131 is formed of a transparent material such as ITO or IZO. Also, the first electrode may be may be replaced with any other metal such as silver (Ag), an Ag alloy, copper (Cu), a Cu alloy, aluminum (Al), an Al alloy, aluminum-neodymium, and the like.

The organic layer 135 is disposed in a display area and emits light through a current applied from the first electrode 131. The organic layer 135 may include a hole injection layer (HIL), a hole transport layer (HTL), an emission layer (EML), an electron transport layer (ETL), an electron injection layer (EIL), and the like, The second electrode 139 is disposed on the organic layer 135 and applies a voltage to the organic layer 135 to correspond to the first electrode 131. The second electrode 139 is formed of a transparent conductive material such as ITO or IZO. Also, the second electrode 139 may be replaced with any other metal such as silver (Ag), an Ag alloy, copper (Cu), a Cu alloy, aluminum (Al), an Al alloy, aluminum-neodymium, and the like.

Thereafter, the encapsulant layer 140 is disposed on a front surface of the substrate 110 on which the second electrode 139 is formed. The encapsulant layer 140 may protect the OLED from an external impact, and prevent transmission of moisture to the OLED vulnerable to moisture. The encapsulant layer 140 may be formed of an epoxy-based compound, an acrylate compound, or an acrylic compound.

The substrate 110 as a manufacturing basis of the organic light emitting display device may be protected through the substrate insulating film 111. That is, since the substrate insulating film 111 is disposed on the outer surface of the substrate 110 to cover the substrate 110, the etchant cannot penetrate through the substrate 110. Thus, the substrate 110 is not damaged. Also, since a current cannot flow in the substrate insulating film 111 as a nonconductor, a current does not flow in the substrate 110, preventing the substrate from being cut.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for manufacturing an organic light emitting display device, the method comprising:
    forming a substrate insulating film on an upper surface, a lower surface, and all side surfaces of an electrically conductive substrate;
    forming an organic light emitting diode (OLED) on a front surface of the substrate insulating film;
    forming an encapsulant layer on the OLED, the encapsulant layer in direct contact with the front surface of the substrate insulating film; and
    exposing at least two side surfaces of the electrically conductive substrate through the substrate insulating film by cutting the electrically conductive substrate and the substrate insulating film,
    wherein the substrate insulating film is formed as a multi-layer of an organic insulating material and an inorganic insulating material, and
    wherein the organic insulating material is one of benzocyclobutene (BCB) or an acrylic resin, and the inorganic insulating material is one of $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, or $SiN_x$.

2. The method of claim 1, wherein the electrically conductive substrate comprises a metal foil substrate.

3. The method of claim 1, wherein the substrate insulating film is formed to have a thickness within a range from 1 μm to 10 μm, inclusive.

4. The method of claim 1, further comprising:
    attaching a fine filler to only a rear surface of the substrate insulating film,
    wherein the fine filler includes a heat resistant silica material.

5. The method of claim 1, wherein the forming of the substrate insulating film is performed in a roll-to-roll manner.

6. The method of claim 1, wherein forming the substrate insulating film includes forming the substrate insulating film by introducing the electrically conductive substrate to a tank filled with an insulating material.

7. The method of claim 1, further comprising:
    attaching a fine filler to only a rear surface of the substrate insulating film.

8. An organic light emitting display device comprising:
    an electrically conductive substrate having a first surface, a second surface opposite to the first surface, and side surfaces that extend between the first surface and the second surface;
    a substrate insulating film disposed on the first surface, the second surface, and one or two of the side surfaces of the electrically conductive substrate;
    an organic light emitting diode (OLED) disposed on the substrate insulating film, the substrate insulating film extending between the OLED and the first surface of the electrically conductive substrate, the OLED having at least one side edge aligned with a corresponding side surface of the electrically conductive substrate; and an encapsulant layer on the OLED, the encapsulant layer in direct contact with the substrate insulating film, wherein two or three of the side surfaces of the electrically conductive substrate are exposed through the substrate insulating film.

9. The organic light emitting display device of claim 8, wherein the substrate insulating film is a multi-layer of an organic insulating material and an inorganic insulating material, and wherein the organic insulating material is one of benzocyclobutene (BCB) or an acrylic resin, and the inorganic insulating material is one of $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, or $SiN_x$.

10. The organic light emitting display device of claim 8, wherein the substrate insulating film is disposed on two of the side surfaces of the electrically conductive substrate.

11. The organic light emitting display device of claim 8, wherein a thickness of the substrate insulating film is within a range from 1 μm to 10 μm, inclusive.

12. The organic light emitting display device of claim 8, wherein the substrate insulating film is formed as one of a single layer or a multi-layer of an organic insulating material and an inorganic insulating material.

13. The organic light emitting display device of claim 10, wherein a fine filler is provided on only one surface of the substrate insulating film, the substrate insulating film extending between the fine filler and the second surface of the electrically conductive substrate.

14. The organic light emitting display device of claim 13, wherein the fine filler includes a heat resistant silica material.

15. The organic light emitting display device of claim 14, wherein the fine filler includes a plurality of spherical shaped objects, each having a diameter of at least 0.1 μm.

16. The organic light emitting display device of claim 13, wherein the substrate insulating film includes an inorganic insulating material including at least one of: $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, and $SiN_x$, and wherein the fine filler includes a heat resistant silica material.

17. The organic light emitting display device of claim 8, wherein a first portion of the electrically conductive substrate extends outwardly along a first direction beyond a first side edge of the OLED to a first side surface of the electrically conductive substrate that is exposed through the substrate insulating film, a second side surface of the electrically conductive substrate that is opposite the first side surface along the first direction is covered by the substrate insulating film, a first portion of the encapsulant layer directly contacts a front surface of the substrate insulating film at a position that overlaps the first portion of the electrically conductive substrate along a second direction that is perpendicular to the first direction, and a second portion of the encapsulant layer directly contacts a front surface of the substrate insulating film at a position that does not overlap the electrically conductive substrate along the second direction.

18. The organic light emitting display device of claim 8, wherein the electrically conductive substrate comprises a metal foil substrate.

* * * * *

UNITED STATES PATENT AND TRADEMARK OFFICE
CERTIFICATE OF CORRECTION

PATENT NO. : 10,686,147 B2  
APPLICATION NO. : 15/703806  
DATED : June 16, 2020  
INVENTOR(S) : Sungwoo Choi Page 1 of 1

It is certified that error appears in the above-identified patent and that said Letters Patent is hereby corrected as shown below:

In the Claims

<u>Column 12, Line 25 In Claim 17:</u>
"portion of the encapsulant layer directly contacts a front" should read, -- portion of the encapsulant layer directly contacts the front --.

Signed and Sealed this  
Twenty-seventh Day of October, 2020

Andrei Iancu  
*Director of the United States Patent and Trademark Office*